(12) United States Patent
Klose et al.

(10) Patent No.: US 6,441,424 B1
(45) Date of Patent: Aug. 27, 2002

(54) INTEGRATED CIRCUIT CONFIGURATION HAVING AT LEAST ONE CAPACITOR AND METHOD FOR PRODUCING THE SAME

(75) Inventors: Helmut Klose, Poughkeepsie, NY (US); Volker Lehmann, München (DE); Hans Reisinger, Grünwald (DE); Wolfgang Hönlein, Unterhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/176,558

(22) Filed: Oct. 21, 1998

(30) Foreign Application Priority Data

Oct. 21, 1997 (DE) .......................................... 197 46 416

(51) Int. Cl.$^7$ ............................................... H01L 29/94

(52) U.S. Cl. ...................... 257/308; 257/306; 257/309; 438/253; 438/396

(58) Field of Search ................................ 257/306, 309, 257/308; 438/253, 396, FOR 430, 455, FOR 212, FOR 220

(56) References Cited

U.S. PATENT DOCUMENTS

| 5,241,201 A | | 8/1993 | Matsuo et al. |
| 5,739,565 A | * | 4/1998 | Nakamura et al. |
| 6,030,866 A | * | 2/2000 | Choi |

FOREIGN PATENT DOCUMENTS

DE 19519160 C1 9/1996

OTHER PUBLICATIONS

"Trench and Compact Structure for dRAMS", Pallab Chatterjee et al., IEDM 86, pp. 128–131.
"A 1.28 $\mu m^2$ Bit Line Shielded Memory Cell Technology for 64Mb DRAMs", Y. Kawamoto et al., Techn. Digest of VLSI Symposium 1990, p. 13.
Japanese Patent Abstract No. 06013547 (Masanobu), dated Jan. 21, 1994.
V. Lehmann et al.: "Siko—A New Capacitor Technology Based on Porous Silicon", Carts Europe 95, 1995, pp. 107–109.
V. Lehmann: "Porous Silicon—A New Material for MEMs", 1996 IEEE, pp. 1–6.
"Developments in porous silicon research", V. Lehmann, Material Letters 28, 1996, pp. 245–249.
"Fabrication of Three–Dimensional IC Using Cumulative Bonded IC" (Cubic) Technology, Y. Hayashi et al., Symposium on VLSI Technology, 1990, pp. 95–96.

* cited by examiner

Primary Examiner—George Fourson
Assistant Examiner—Michelle Estrada
(74) Attorney, Agent, or Firm—Laurence A. Greenberg; Werner H. Stemer; Ralph E. Locher

(57) ABSTRACT

An integrated circuit configuration, in particular is a DRAM cell configuration, includes a capacitor disposed on a first substrate and a portion with a contact disposed on a second substrate. The first substrate is connected to the second substrate, with the contact adjoining the capacitor. The first substrate and the second substrate can be connected essentially in an unadjusted manner, if capacitor elements are distributed over the first substrate and a contact surface of the contact is so large that when the substrates are connected, the contact in each case adjoins at least one of the capacitor elements, which then defines the capacitor. The capacitor may include a plurality of capacitor elements, which makes its capacitance especially high. A method is also provided for producing the integrated circuit configuration.

25 Claims, 2 Drawing Sheets

INTEGRATED CIRCUIT CONFIGURATION HAVING AT LEAST ONE CAPACITOR AND METHOD FOR PRODUCING THE SAME

BACKGROUND OF THE INVENTION

Field of the Invention

The invention relates to an integrated circuit configuration having at least one capacitor and a method for producing an integrated circuit configuration having at least one capacitor.

In the development of new integrated circuit configurations, one goal is increased packing density. That is usually achieved currently with planar silicon technology.

One possible way of increasing the packing density is to make a capacitor of a circuit configuration not in planar form but rather in a trench (see, for Instance, an article entitled "Trench and Compact structures for DRAMs", by P. Chatterjee et al, in IEDM 86, pp. 128–131). The trench is created by a photolithographic process in a semiconductor substrate in which the circuit configuration is disposed. In the case of structure sizes below 200 nm, that concept becomes problematic, since when the trench structure is created edge offsets often occur, along which conductive channels form that then extend through neighboring components of the circuit configuration. Problems also arise in producing the trench, because of the extreme differences between the width and depth of the capacitor.

An article entitled "A 1.28 $\mu m^2$ Bit-Line Shielded Memory Cell Technology for 64 Mb DRAMs", by Y. Kawamoto et al, in Techn. Digest of VLSI Symposium 1990, p. 13, proposes forming a capacitor as a stacked capacitor. Increasing the surface area and thus the capacitance of the storage capacitor requires a relatively complicated structure of polysilicon, which is all the more difficult to make as the packing density becomes higher.

When components are created by photolithographic processes, a limit is set on the packing density, on one hand by the minimal structural size F that can be achieved in the particular technology and on the other hand by inaccuracies in the adjustment, which amount to approximately ⅓ F. In order to further increase the packing density, German Patent DE 195 19 160 C1, for instance, has proposed creating components in a DRAM cell configuration in self-adjusted form, that is without using masks which have to be adjusted.

In an article entitled "Developments in Porous Silicon Research" by V. Lehmann, in Material Letters 28 (1996), pp. 245–249, the creation of capacitors in a silicon substrate is described. To that end, notches are made in the silicon substrate through the use of a photolithographic process, and pores are created from those notches by ensuing electrochemical etching. The pores are then provided with a capacitor dielectric and with storage nodes.

It is known from an article entitled "Fabrication of Three-Dimensional IC Using 'Cumulatively Bonded IC' (Cubic) Technology" by Y. Hayashi et al, in Symposium on VLSI Technology (1990), pp. 95–96, to connect substrates that include components through the use of an adhesive layer of polyimide. Contacts between the substrates are made through tungsten pins and associated large-area indentations, which are filled with a gold-indium alloy.

SUMMARY OF THE INVENTION

It is accordingly an object of the invention to provide an integrated circuit configuration having at least one capacitor and a method for producing the same, which overcome the hereinafore-mentioned disadvantages of the heretofore-known devices and methods of this general type and in which the integrated circuit configuration can be made with an especially high packing density.

With the foregoing and other objects in view there is provided, in accordance with the invention, an integrated circuit configuration having at least one capacitor, comprising a first substrate having a surface and at least one zone adjoining the surface; a second substrate having a surface with a region; at least two capacitor elements disposed in the at least one zone of the first substrate and spaced apart by a given distance; at least one contact disposed in the region of the surface of the second substrate, the at least one contact having a contact surface adjoining at least one of the capacitor elements, the contact surface having a cross section parallel to the surface of the first substrate, and the cross section having at least one dimension larger than the given distance; and the capacitor elements including capacitor elements disposed adjacent the contact surface and forming a capacitor.

With the objects of the invention in view, there is also provided a method for producing an integrated circuit configuration having at least one capacitor, which comprises producing at least two capacitor elements in at least one zone of a first substrate adjoining a surface of the first substrate, and spacing the capacitor elements apart by a given distance; producing at least one contact on a second substrate, in a region of a surface of the second substrate, and setting at least one dimension of a cross section of a contact surface of the at least one contact parallel to the surface of the first substrate to be larger than the given distance; joining the first substrate and the second substrate, with the contact surface adjoining at least one of the capacitor elements; and forming a capacitor of at least one of the capacitor elements adjoining the contact surface.

In the circuit configuration of the invention, the first substrate is connected to the second substrate. The capacitor is disposed in the first substrate, and the contact is disposed in the second substrate. The contact surface of the contact adjoins the capacitor. The contact connects the capacitor with a portion of the circuit configuration that is disposed in the second substrate. The capacitor includes at least one of two capacitor elements, which are disposed in a zone of the first substrate adjoining a surface of the first substrate. A cross section of the contact surface that is parallel to the surface is larger in at least one dimension than a distance between the two capacitor elements.

In accordance with another feature of the invention, the adjustment tolerance when the capacitor is being contacted, that is when the substrates are being connected, can be increased without decreasing the packing density if the contacting first defines which one of the capacitor elements forms the capacitor. To that end, the contact surface in at least one dimension is also larger than a distance between one of the capacitor elements and one edge of the zone. In that case, the contact surface need not be disposed in a particular portion but rather can be disposed in any arbitrary portion of the zone, since in every case the contact surface adjoins at least one of the capacitor elements, which then defines the capacitor. The larger the zone, the greater the adjustment tolerance. Connecting the first substrate to the second substrate can be carried out in an essentially unadjusted manner, if the capacitor elements are distributed over the first substrate in such a way, and a contact surface of the contact is so large, that when the substrates are connected the contact in every case adjoins at least one of the capacitor elements, which then defines the capacitor.

The packing density becomes higher, as the capacitor elements become closer together and as the contact surface becomes smaller. A high adjustment tolerance and a high packing density can accordingly be attained if the zone is large, many capacitor elements are disposed in the zone at short distances from one another, and the dimension of the cross section of the contact surface is only slightly greater than the distances. In that case, distances between the edge of the zone and the capacitor elements neighboring it are preferably no greater than the distance between capacitor elements neighboring one another.

In accordance with a further feature of the invention, the capacitor includes more than one capacitor element. This increases the surface area and thus the capacitance of the capacitor. In that case, the contact surface is correspondingly larger.

In accordance with an added feature of the invention, the adjustment tolerance can be increased in this case as well, if the contact surface in at least one dimension is also greater than twice the distance between one of the capacitor elements and one edge of the zone, and if the contact surface is disposed inside the zone of the first substrate.

The circuit configuration may also include a plurality of capacitors and a plurality of contact surfaces. In that case, capacitor elements may be disposed in a single zone, which is then adjoined by the contact surfaces.

In accordance with an additional feature of the invention, the circuit configuration is, for instance, a DRAM cell configuration. In that case, selection transistors, having second source-to-drain zones connected to bit lines and gate electrodes connected to word lines extending transversely to the bit lines, are disposed on the second substrate. The contacts are disposed on first source-to-drain zones. In order to increase the packing density, the selection transistors can be constructed vertically. The word lines can be constructed as spacers. In that case, an area of a memory cell can be $4F^2$ or less.

In accordance with yet another feature of the invention, the capacitor elements are distributed over the zone regularly, irregularly, and/or in short-range order.

In accordance with another mode of the invention, in order to produce the capacitor elements, the first substrate can be formed of semiconductor material that is electrochemically etched. The resultant pores are filled with a capacitor dielectric. In order to create storage nodes of the capacitor elements, conductive material is applied. The storage nodes of the capacitor elements can be insulated from one another by structuring the conductive material.

In the electrochemical etching, the substrate can be connected as a positively polarized electrode of an electrolysis cell containing a medium that contains hydrofluoric acid. Applying a potential creates pores in the first substrate. The capacitor elements are made in the pores. Depending on the current intensity and the dopant concentration of the first substrate, the pores are between 10 nm and 100 nm wide and are distributed either regularly or irregularly.

In accordance with a further mode of the invention, distances between neighboring capacitor elements may be approximately equal. This is the case, for instance, in an n-doped substrate for a current density of approximately 100 $mA/cm^2$ and a dopant concentration of approximately $10^{18}$ $cm^{-3}$.

In accordance with an added mode of the invention, both approximately equal distances between the capacitor elements and a three-dimensionally regular configuration of capacitor elements are obtained if the first substrate is prestructured. To that end, small notches, for instance distributed regularly, are made in the first substrate and define the three-dimensional disposition of the pores. The pores are created at those points where the notches have been made. The notches can be made, for instance, by a photolithographic process. It is also possible to employ interference phenomena of monochromatic coherent light for this purpose.

If the first substrate and the second substrate are connected to one another with a high adjustment tolerance, and if the capacitor elements are disposed irregularly but at approximately equal distances from one another, then it is advantageous if the contact surface is approximately ten times as great as the distance between centers of neighboring capacitor elements. Since the deviation in the number of capacitor elements of a capacitor, with equal distances among capacitor elements, is only approximately one, the capacitance of the capacitor can thereby be defined relatively precisely.

In accordance with an additional mode of the invention, connecting the first substrate to the second substrate is performed eutectically, for instance.

In accordance with yet another mode of the invention, to that end, for the contact surface, gold is, for instance, applied to the contact and/or the storage node.

In accordance with a yet a further mode of the invention, next, the first substrate and the second substrate are joined together and heated to approximately 400 to 500° C., as a result of which the first substrate is firmly connected to the second substrate.

The capacitor dielectric may be formed of an ONO layer, for instance. In this case, the letter O stands for silicon oxide and the letter N for silicon nitride. However, other dielectric materials, such as ceramics, are also conceivable.

In order to increase the capacitance of the capacitor, it is advantageous if the first substrate in a layer adjoining the surface of the first substrate is highly doped. The layer can be made by implantation, for instance.

In accordance with a concomitant mode of the invention, alternatively, after the pores have been created, a diffusion source can be deposited, from which dopant diffuses into the substrate by tempering. The dopant source can then be removed, whereupon the capacitor dielectric can be made. Phosphorus silicate glass is, for instance, suitable as the dopant source.

Doped polysilicon can, for instance, be used as the conductive material for the storage node. In order to insulate the storage nodes from one another, the polysilicon can be subsequently chemically-mechanically polished and/or back-etched. The storage nodes on the far side of the surface of the first substrate can be enlarged by subsequent epitaxial growth, facilitating the connection with the contact surface.

Other features which are considered as characteristic for the invention are set forth in the appended claims.

Although the invention is illustrated and described herein as embodied in an integrated circuit configuration having at least one capacitor and a method for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
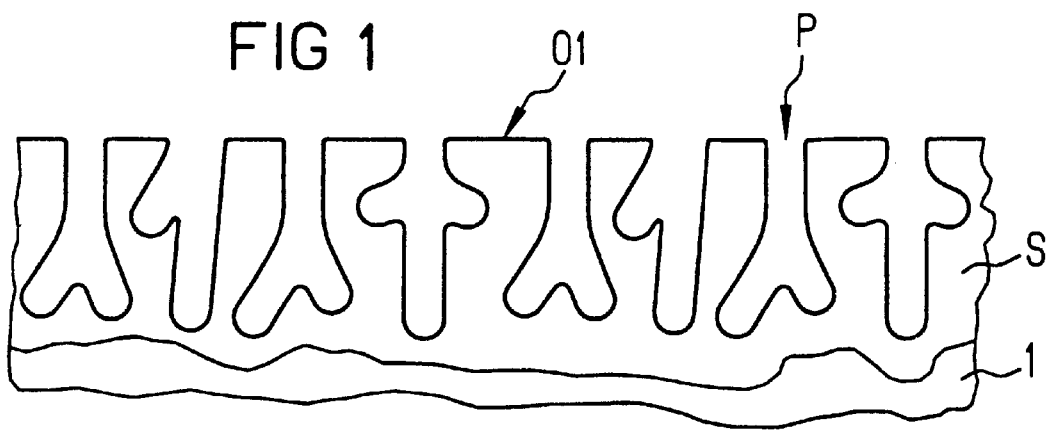
FIG. 1 is a fragmentary, diagrammatic, plan view of a first substrate after pores have been made by electrochemical etching.

Referring now in detail to the figures of the drawings, which are not to scale, and first, particularly, to FIG. 1 thereof, there is seen an exemplary embodiment in which a first substrate 1 contains n-doped silicon. The dopant concentration of the silicon is approximately $10^{18}$ cm$^{-3}$. The first substrate 1 is connected to a first voltage terminal and dipped into a hydrofluoric acid solution (25 weight %). An electrode, which is connected to a second voltage terminal, is located in the hydrofluoric acid solution. Next, a voltage amounting to approximately 2 V is generated between the first voltage terminal and the second voltage terminal. A voltage difference between the first voltage terminal and the second voltage terminal is positive. A resultant current density is approximately 100 mA/cm$^2$. After several minutes, pores P approximately 100 nm wide and a few micrometers deep have been created in the first substrate 1. Once a desired pore depth is reached, the electrochemical etching is stopped. Distances between centers of neighboring pores P are approximately equal and amount to approximately 20' nm, as is seen in FIG. 1. The pores P are not disposed regularly in three-dimensional terms.

In order to create a highly doped layer S, phosphorus silicate glass in a thickness of a few nanometers is applied as a dopant source over a surface O1 of the first substrate 1. Next, dopant from the phosphorous silicate glass is diffused out into the first substrate 1 by tempering, to a depth of approximately 100 nm, thus creating the layer S. The layer S is n-doped, and its dopant concentration is approximately $10^{20}$ cm$^{-3}$. The layer S is suitable as a capacitor plate of capacitors.

Next, the phosphorus silicate glass is removed. HF, for instance, is suitable as an etchant.

An ONO layer is created in order to create a capacitor dielectric Kd. The letter O stands for silicon oxide and the letter N for silicon nitride. To that end, a silicon oxide layer approximately 2 nm thick is first grown on by thermal oxidation. Next, approximately 4 nm of silicon nitride are deposited, which oxidizes to a depth of approximately 2 nm according to FIG. 2.

Figure 2:
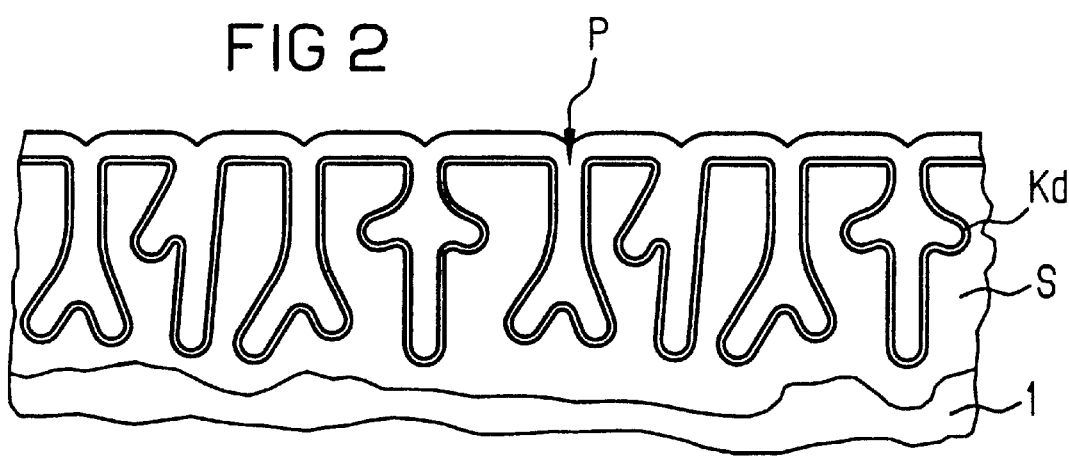
FIG. 2 is a view similar to FIG. 1 showing the first substrate once a layer and a capacitor dielectric have been made, and after a doped polysilicon layer has been deposited.
Figure 3:
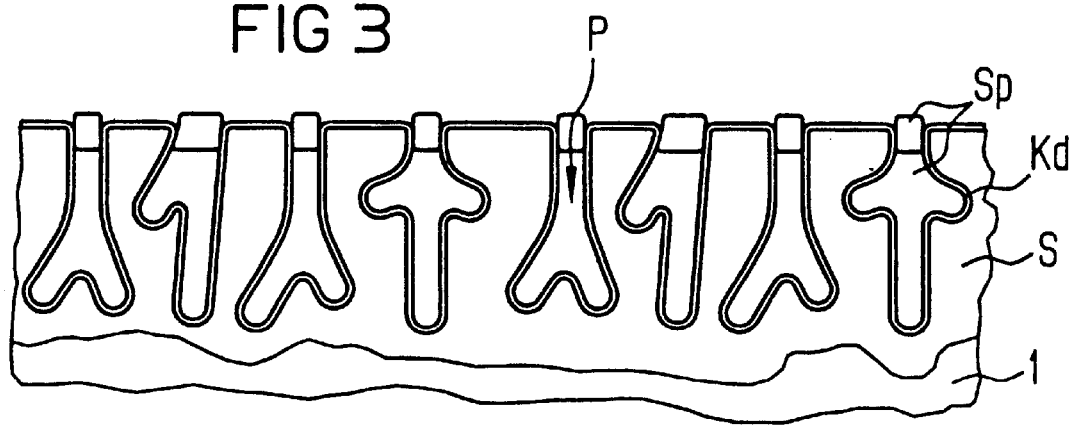
FIG. 3 is a view similar to FIGS. 1 and 2 showing the first substrate after storage nodes have been created, by back-etching of the doped polysilicon layer and ensuing epitaxial growth.

Doped polysilicon is then deposited in a thickness of 5 nm according to FIG. 2, in order to create storage nodes Sp of capacitor elements or partial capacitors. The storage nodes Sp of various capacitor elements are insulated from one another by back-etching according to FIG. 3. The capacitor dielectric Kd is partially exposed thereby. Next, the storage nodes Sp are lengthened by selective epitaxy as far as a far side of the surface O1 of the first substrate 1 according to FIG. 3.

Figure 4:
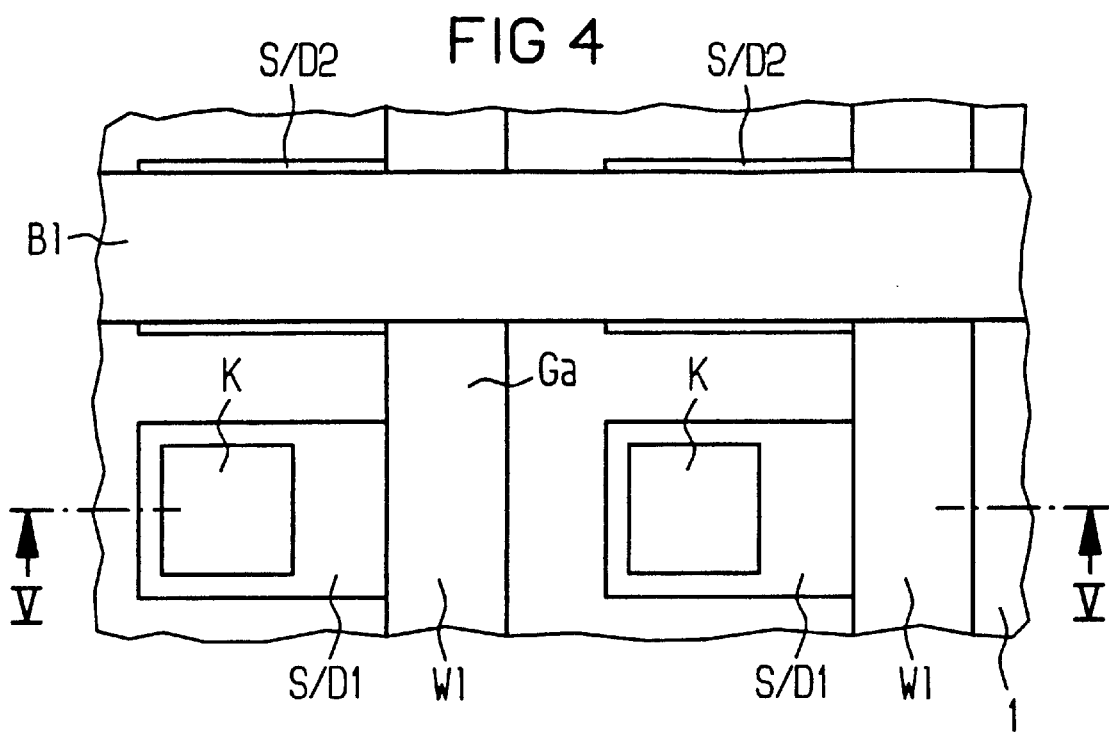
FIG. 4 is a fragmentary, plan view of a second substrate, once selection transistors, word lines, bit lines, and contacts have been made.

Selection transistors, word lines and bit lines are created in a second substrate 2 seen in FIG. 4. The selection transistors are planar transistors, for instance. However, they may also, for instance, be vertical transistors. First source-to-drain regions S/D1 of the selection transistors are provided with contacts K. The contacts K may, for example, include 100 nm of doped polysilicon and 200 nm of tungsten. Second source-to-drain zones S/D2 of the selection transistors are connected to bit lines B1. The bit lines B1 extend transversely to word lines W1. Gate electrodes Ga of the selection transistors adjoin a gate dielectric Gd and are connected to the word lines W1. The word lines W1 are covered by a first insulating structure I1 of silicon nitride, for example. By way of example, the word lines W1 and the bit lines B1 may contain polysilicon, MoSi, and/or aluminum.

In order to create a second insulating structure I2 that is approximately 500 nm thick, $SiO_2$ is deposited in a thickness of approximately 500 nm, and planarized by chemical-mechanical polishing until contact surfaces KF of the contacts K are laid bare, and back-etched. The second insulating structure I2 protects portions of the circuit configuration that are located on the second substrate 2.

Figure 5:
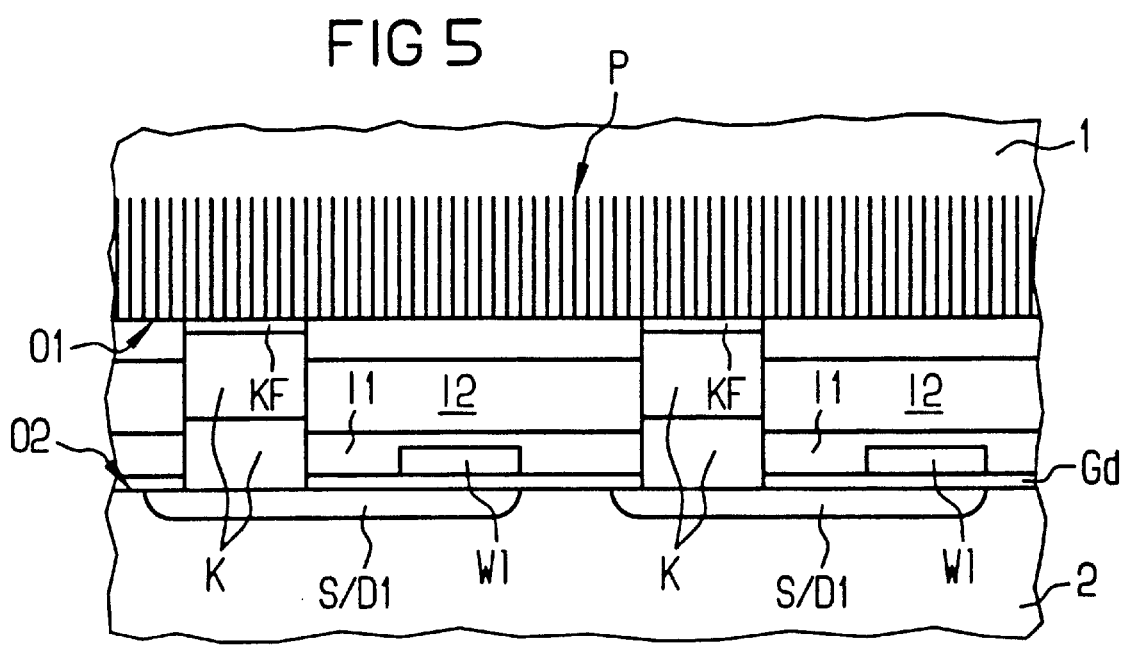
FIG. 5 is a cross-sectional view of the first substrate and the second substrate taken along a line V—V of FIG. 4, in the direction of the arrows, once the first substrate and the second substrate have been connected to one another in an unadjusted manner.

The contact surfaces KF of the contacts K are then gold-plated. The first substrate 1 and the second substrate 2 are connected to one another in an unadjusted manner, in such a way that the first substrate 1 and the second substrate 2 are joined together and heated to approximately 400 to 500° C. according to FIG. 5.

We claim:

1. An integrated circuit configuration, comprising:

a first substrate having a surface and at least one zone adjoining said surface;

a second substrate having a surface with a region;

at least two capacitor elements disposed in said at least one zone of said first substrate and spaced apart by a given distance;

at least one contact disposed in said region of said surface of said second substrate, said at least one contact having a contact surface adjoining at least one of said capacitor elements, said contact surface having a cross section parallel to said surface of said first substrate, and said cross section having at least one dimension larger than said given distance, allowing connection of said at least two capacitor elements in an essentially unadjusted manner; and said capacitor elements including capacitor elements disposed adjacent said contact surface and forming a capacitor.

2. The circuit configuration according to claim 1, wherein:

said zone has an edge defining a predetermined distance between one of said capacitor elements and said edge;

said at least one dimension of said cross section of said contact surface is greater than said predetermined distance;

said contact surface adjoins at least a portion of said region and thereby adjoins at least a first one of said capacitor elements; and said contact surface is not adjacent outside said region.

3. The circuit configuration according to claim 1, wherein said capacitor includes at least two of said capacitor elements.

4. The circuit configuration according to claim 3, wherein:
said capacitor elements have centers spaced apart by a predetermined distance;
said zone has one edge spaced apart from one of said capacitor elements by a set distance;
said at least one dimension of said cross section of said contact surface is at least twice as great said predetermined distance and as said set distance; and
said contact surface adjoins at least a portion of said zone and thereby adjoins at least two of said capacitor elements.

5. The circuit configuration according to claim 1, wherein said capacitor elements are distributed irregularly over said zone.

6. The circuit configuration according to claim 1, wherein said capacitor elements are distributed in short-range order over said zone.

7. The circuit configuration according to claim 1, wherein neighboring capacitor elements are spaced apart by approximately equal distances.

8. The circuit configuration according to claim 7, wherein said capacitor includes at least five of said capacitor elements.

9. The circuit configuration according to claim 1, wherein said surface s of said first and second substrates are first surfaces, said first and second substrates have second surfaces opposite said first surfaces, and a further contact is disposed on at least one of said second surfaces.

10. A DRAM cell configuration having at least one capacitor, comprising:
a first substrate having a surface and at least one zone adjoining said surface;
a second substrate having a surface with a region;
at least two capacitor elements disposed in said at least one zone of said first substrate and spaced apart by a given distance;
at least one contact disposed in said region of said surface of said second substrate, said at least one contact having a contact surface adjoining at least one of said capacitor elements, said contact surface having a cross section parallel to said surface of said first substrate, and said cross section having at least one dimension larger than said given distance, allowing connection of said at least two capacitor elements in an essentially unadjusted manner; and
said capacitor elements including capacitor elements disposed adjacent said contact surface and forming a capacitor.

11. A method for producing an integrated circuit configuration, which comprises:
producing at least two capacitor elements in at least one zone of a first substrate adjoining a surface of the first substrate, and spacing the capacitor elements apart by a given distance;
producing at least one contact on a second substrate, in a region of a surface of the second substrate, and setting at least one dimension of a cross section of a contact surface of the at least one contact parallel to the surface of the first substrate to be larger than the given distance;
joining the first substrate and the second substrate in an essentially unadjusted manner, with the contact surface adjoining at least two of the capacitor elements; and
forming a capacitor of at least two of the capacitor elements adjoining the contact surface.

12. The method according to claim 11, which comprises:
producing the contact surface with the at least one dimension of its cross section greater than a distance between one of the capacitor elements and one edge of the zone;
forming the contact surface adjoining at least one portion of the zone and thereby adjoining at least a first of the capacitor elements; and
forming the contact surface inside the zone, adjoining the surface of the first substrate.

13. The method according to claim 11, which comprises forming the capacitor of at least two of the capacitor elements.

14. The method according to claim 13, which comprises:
producing the contact surface with the at least one dimension of its cross section at least twice as large as a distance between centers of the capacitor elements and as a distance between one of the capacitor elements and one edge of the zone; and
forming the contact surface adjoining at least a portion of the zone and thereby adjoining at least two of the capacitor elements.

15. The method according to claim 11, which comprises distributing the capacitor elements irregularly over the zone.

16. The method according to claim 11, which comprises distributing the capacitor elements in short-range order over the zone.

17. The method according to claim 11, which comprises producing the capacitor elements with approximately equal distances between neighboring capacitor elements.

18. The method according to claim 17, which comprises forming the capacitor of at least five of the capacitor elements.

19. The method according to claim 11, which comprises designating the surfaces of the substrates as first surfaces, and providing a further contact on a second surface of at least one of the substrates opposite the first surface.

20. The method according to claim 11, which comprises producing a DRAM cell configuration.

21. The method according to claim 11, which comprises:
creating pores in the first substrate by electrochemical etching to create the capacitor elements;
providing the pores with a capacitor dielectric; and
applying and structuring conductive material to create storage nodes of the capacitor elements.

22. The method according to claim 21, which comprises:
depositing a dopant source after the pores have been created in the first substrate containing semiconductor material at a first dopant concentration; and
diffusing dopant of the dopant source into the first substrate by tempering, thereby producing a layer with a second dopant concentration inside the first substrate.

23. The method according to claim 21, which comprises prestructuring the first substrate before the pores are created, thereby specifying a three-dimensional disposition of the pores.

24. The method according to claim 11, which comprises eutectically joining the first substrate and the second substrate.

25. The method according to claim 24, which comprises:
providing at least one of the contact surface and the storage node with gold; and
joining together and heating the first substrate and the second substrate to approximately 400° C. to 500° C.

* * * * *